United States Patent [19]
Mineyoshi et al.

[11] Patent Number: 5,631,515
[45] Date of Patent: May 20, 1997

[54] SURFACE ACOUSTIC WAVE DEVICE

[75] Inventors: Seiji Mineyoshi; Osamu Kawachi, both of Kawasaki, Japan

[73] Assignee: Fujitsu Limited, Kawasaki, Japan

[21] Appl. No.: 404,310

[22] Filed: Mar. 15, 1995

[30] Foreign Application Priority Data

Mar. 17, 1994 [JP] Japan .................. 6-046707
Dec. 13, 1994 [JP] Japan .................. 6-308487

[51] Int. Cl.$^6$ ........................... H01L 41/08
[52] U.S. Cl. .................. 310/313 B; 310/313 D
[58] Field of Search ............ 310/313 R, 313 B, 310/313 D; 333/150–155, 193–196

[56] References Cited

U.S. PATENT DOCUMENTS

| | | | |
|---|---|---|---|
| 4,097,825 | 6/1978 | Gerard | 310/313 D X |
| 4,635,009 | 1/1987 | Ebata | 333/195 |
| 4,837,476 | 6/1989 | Mochizuki | 310/313 R |
| 5,061,871 | 10/1991 | Wright | 310/313 B |
| 5,264,751 | 11/1993 | Dufilie et al. | 310/313 B |
| 5,406,159 | 4/1995 | Wright | 310/313 D |
| 5,485,052 | 1/1996 | Seki et al. | 310/313 B |

*Primary Examiner*—Mark O. Budd
*Attorney, Agent, or Firm*—Nikaido, Marmelstein, Murray & Oram LLP

[57] ABSTRACT

A surface acoustic wave device is designed such that an inter-digital transducer and a reflector have the same grating cycle. The electrode dye width of the reflector is larger than that of the inter-digital transducer, or the electrode dye width is smaller than the distance between the electrodes by changing at least one of the inter-digital transducer and the reflector. Connecting the thus structured surface acoustic wave devices to a single piezoelectric substrate as resonators in a ladder form produces a surface acoustic wave device for use in a filter.

35 Claims, 8 Drawing Sheets

SURFACE ACOUSTIC WAVE DEVICE

BACKGROUND OF THE INVENTION

1. Field of the Invention

The present invention relates to a surface acoustic wave device to be used in a resonator, a narrowband filter, a resonant filter, an oscillator, etc.

2. Description of the Related Art

With an increasing demand for small-size portable and cordless telephone sets, a high-performance filter is required to properly process radio signals. The signal is to be small-size and loss and to excel in damping property. A surface acoustic wave device is used in the high-performance filter. A surface acoustic wave (SAW) is excited by applying a electric field to a piezoelectric monocrystal or ceramic substrate, and propagates energy more than 90 percent of which is concentrated to the depth within one wave length from the surface of the substrate.

As compared with a filter using a bulk wave, the filter comprising the surface acoustic wave device can tap a signal from any point in a propagation path, and utilizes the merits of the surface acoustic wave such as controllability of propagation property. When compared with an LC circuit and a cavity resonator, it advantageously has a very high Q value.

FIG. 1 shows a general appearance of a model of a conventional surface acoustic wave device (surface acoustic wave resonator). As shown in FIG. 1, the surface acoustic wave device 1 comprises an inter-digital transducer (IDT) 3 on the surface of an piezoelectric monocrystal substrate 2, and a reflectors 4 mounted on both sides of the inter-digital transducer 3. The reflector 4 is a short-strip reflector. The inter-digital transducer 3 comprises two comb-shaped driving electrodes 3a and 3b mounted as opposed to each other. Electrode fingers 3c of the comb-shaped driving electrode 3a and those of the comb-shaped driving electrode 3b are inserted to one another.

In the above described surface acoustic wave device 1, the relation between the wave length λ of the surface acoustic wave excited by the inter-digital transducer 3 and an inter-electrode distance L3 can be calculated by the following equation.

$$L3 = \lambda/2$$

where normally $L3 = \lambda/2 + n\lambda$ ($n = 0, 1, 2, \ldots$) The propagation velocity $v_s$ of the surface acoustic wave can be calculated by the equation $v_s = f_0 \cdot \lambda$ where $f_0$ indicates the center frequency of the surface acoustic wave device 1. Thus, the center frequency $f_0$ can be calculated by the following equation.

$$f_0 = v_s/2 \cdot L3$$

where $v_s$ indicates the propagation velocity of the surface acoustic wave.

FIG. 2 shows the resonance characteristic of the surface acoustic wave device 1. In FIG. 2, $\Delta f$ indicates a passband width. The surface acoustic wave device 1 controls the inter-electrode distance L3 of the inter-digital transducer 3 so that the wave length λ of the surface acoustic wave, that is, the center frequency $f_0$, can be properly controlled. The passband width $\Delta f$ can also be controlled by increasing or decreasing the number of pairs of electrodes (number of pairs of electrode fingers 3c) of the inter-digital transducer 3. The passband width $\Delta f$ becomes narrower as the number of pairs of the electrodes increases.

The inter-electrode distance L4 of the reflector 4 is equal to the inter-electrode distance L3 of the inter-digital transducer 3 because a standing wave is generated in the surface acoustic wave device 1 by reflecting the surface acoustic wave of the wave length λ0 excited by the inter-digital transducer 3. The electrode dye width L1 of the comb-shaped driving electrodes 3a and 3b is a half of the inter-electrode distance L3, and the electrode dye width L2 of the reflector 4 is a half of the inter-electrode distance L4. These inter-electrode distances L3 and L4 are hereinafter referred to as "grating cycles" commonly used currently.

In FIG. 1, each of the grating cycles L3 and L4 is shown as the distance between the right-side ends or the left-side ends of the adjacent electrode fingers 3c or 4c. Exactly, they refer to the distance between the centers of the adjacent electrode fingers 3c or 4c. In FIG. 1, the grating cycle is shown such that the relation between the grating cycles L3 and L4 and the electrode finger widths L1 and L2 can be clearly recognized.

The surface acoustic wave device 1 is designed to obtain a resonance characteristic by reflecting the surface acoustic wave excited by the inter-digital transducer 3 on the reflector 4 and by enclosing the surface acoustic wave in the surface acoustic wave device 1. As described above, the passband width $\Delta f$ becomes narrower as the number of pairs of electrodes increases. An input signal is input to input terminal a to excite the surface acoustic wave, and input terminal a is connected to the comb-shaped driving electrode 3a. Output terminal b through which an electric signal of a frequency in the passband width $\Delta f$ is connected to the other comb-shaped driving electrode 3b. Thus, output from output terminal b are only the components in the passband width $\Delta f$ with the center frequency $f_0$ positioned in the center.

As described above, the surface acoustic wave device 1 encloses energy such that larger amplitude of the surface acoustic wave can be generated in the inter-digital transducer 3 based on the difference in frequency between the surface acoustic waves generated by the inter-digital transducer 3 and the reflector 4. The difference in frequency is generated from the difference in propagation velocity between the surface acoustic waves in the inter-digital transducer 3 and reflector 4. The propagation velocity of the surface acoustic wave differs between the inter-digital transducer 3 and reflector 4 based on the following grounds.

That is, the reflector 4 functions as $\Delta V/V$ wave guide path of the surface acoustic waves. The $\Delta V/V$ wave guide path comprises strips of conductive films arranged at predetermined intervals on the piezoelectric substrate. The propagation velocity V of the surface acoustic wave is reduced by $\Delta V$ through a short circuit on the surface of the wave guide path, thereby obtaining an electric field short-circuiting effect.

The inter-digital transducer 3 is divided into an input unit (comb-shaped driving electrode 3a) and an output unit (comb-shaped driving electrode 3b). The electric short-circuit of the inter-digital transducer 3 is smaller than that of the reflector 4. Therefore, the propagation velocity of the surface acoustic wave differs between the inter-digital transducer 3 and the reflector 4. Thus, the propagation velocity $v_d$ of the surface acoustic wave device in the inter-digital transducer 3 is presumably higher than the propagation velocity $v_r$ of the surface acoustic wave in the reflector 4. The propagation velocity of the free surface acoustic wave on the surface of the piezoelectric monocrystal substrate 2 is higher than that of any portion of the inter-digital transducer 3 and the reflector 4. This also proves the above mentioned electric field short-circuiting effect.

As described above, the conventional surface acoustic wave device 1 shown in FIG. 1 encloses energy such that larger amplitude of the surface acoustic wave can be generated in the inter-digital transducer 3 based on the difference in frequency between the surface acoustic waves generated by the inter-digital transducer 3 and the reflector 4. If there is no difference in frequency between the surface acoustic waves of the inter-digital transducer 3 and the reflector 4, or if no appropriate frequency difference is recognized, then a large amount of energy loss lowers the performance of the device (resonator).

The frequency of the surface acoustic wave on each portion of the inter-digital transducer 3 and the reflector 4 is obtained by dividing the propagation velocity of the surface acoustic wave by its wave length $\lambda$. As described above, the wave length $\lambda$ in the inter-digital transducer 3 and the reflector 4 depends on the grating cycle L3 and the grating cycle L4 respectively. The propagation velocity of the surface acoustic wave in the inter-digital transducer 3 is different from that in the reflector 4. The difference in propagation velocity is made on various conditions such as material of the piezoelectric monocrystal substrate 2, available frequency band, etc. Therefore, it is very difficult to optimally control the surface acoustic waves of the inter-digital transducer 3 and the reflector 4 such that a desirable frequency difference can be made.

There are some methods of adjusting the difference in frequency. For example, the grating cycle L3 of the inter-digital transducer 3 is made different from the grating cycle L4 of the reflector 4 (that is, L3 ≠ L4 in FIG. 1). Another method is to vary the thickness of the films of the inter-digital transducer 3 and the reflector 4. However, these conventional methods have the following problems.

If the grating cycle L3 of the inter-digital transducer 3 differs from the grating cycle L4 of the reflector 4, then the surface acoustic wave indicates propagation unconformity. Consequently, spurious is increasingly generated, and the energy enclosure efficiency is lowered by suffering from a larger energy loss from increased bulk wave radiation through the promotion of the mode switch from the surface acoustic wave to the bulk wave. The increasing generation of spurious may result in an energy loss and a narrow band width.

The propagation velocity of the surface acoustic wave also varies with the thickness h of the film of the electrode of the inter-digital transducer 3 and the reflector 4. A larger thickness h of the film lowers the propagation velocity (mass load effect). Using this effect, the thickness of the film of the inter-digital transducer 3 can differ from that of the reflector 4. However, this method has had the problem of increasing the manufacturing steps, complicated operations, manufacture time, and entire cost.

The spurious of the surface acoustic wave device 1 can also be generated by converting a part of the surface acoustic wave into a surface skimming bulk wave.

The surface skimming bulk wave has a feature of generating no difference in propagation velocity between a free surface and a short-circuit surface. Since there is a small difference in propagation velocity between the surface acoustic wave and the surface skimming bulk wave, the surface skimming bulk wave indicates a resonant frequency, thereby badly affecting the characteristics of a resonator. Accordingly, in the conventional technology, the thickness h of the film of the inter-digital transducer 3 and the reflector 4 is increased to lower the propagation velocity of the surface acoustic wave. Thus, the difference in propagation velocity is made larger between the surface skimming bulk wave and the surface acoustic wave to reduce the undesirable affection of the conversion into the surface skimming bulk wave. However, increasing the thickness h of the film of the inter-digital transducer 3 and the reflector 4 causes various problems such as low reliability of the film, low stability of film production, and longer operations required to properly form the inter-digital transducer 3 and the reflector 4.

Furthermore, increasing the thickness h of the film also causes uneven thickness h of the film and causes the problem of producing uneven forms of electrodes (for example, an electrode finger) in an etching process. Therefore produced are uneven propagation velocity of the surface acoustic wave, uneven grating cycles, etc. As a result, the stability of frequency represented by, for example, the precision of a center frequency $f_0$ is undesirably lowered.

There has been the problem to be solved that the conversion from the surface acoustic wave to the surface skimming bulk wave should be reduced because the surface acoustic wave device 1 has a lower energy enclosure efficiency when the surface acoustic wave is converted to a large extent into the surface skimming bulk wave with an increasing generation of spurious.

SUMMARY OF THE INVENTION

The present invention aims at minimizing the generation of spurious and the increase of the radiation of a bulk wave to improve the energy enclosure efficiency of the device and to improve the performance of the device.

The present invention relates to a surface acoustic wave device comprising a piezoelectric monocrystal substrate, an inter-digital transducer mounted to the surface of the piezoelectric monocrystal substrate, and a reflector provided as opposed to each other on both sides of the inter-digital transducer on the piezoelectric monocrystal substrate.

In the surface acoustic wave device, the inter-digital transducer and the reflector are designed to satisfy the following equations where:

L5 indicates the electrode finger width of the inter-digital transducer;

L6 indicates the electrode finger width of the reflector;

L7 indicates the grating cycle of the inter-digital transducer; and

L8 indicates the grating cycle of the reflector.

First, the surface acoustic wave device according to the first aspect of the present invention should satisfy the following equation.

$$\alpha \cdot L5 = L6$$
$$L7 = L8$$

where $\alpha$ indicates a coefficient ($\neq 1$).

In the surface acoustic wave device according to the above described first aspect of the present invention, the value $\alpha$ should desirably be larger than 1 and equal to or smaller than 1.5. The optimum value of $\alpha$ is represented as $1 < \alpha \leq 1.5$.

The surface acoustic wave device according to the second aspect of the present invention should satisfy the following expression.

$$L5/L5 < L6/L8$$

A proper difference in frequency of the surface acoustic wave can retain between the inter-digital transducer and the reflector by forming the surface acoustic wave device as described above. Thus prevented are the generation of spurious and the radiation of a bulk wave. As a result, an insertion loss can be reduced and the surface acoustic wave energy enclosure efficiency can be successfully improved.

The surface acoustic wave device according to the third aspect of the present invention should satisfy the following equations.

$$\alpha \cdot L5 = L6$$
$$L7 = L8$$
$$L6 \ne L8 - L6$$

The surface acoustic wave device according to the fourth aspect of the present invention should satisfy the following equations.

$$\alpha \cdot L5 = L6$$
$$L7 = L8$$
$$L5 \ne L7 - L5$$

The surface acoustic wave device according to the fifth aspect of the present invention should satisfy the following equations.

$$\alpha \cdot L5 = L6$$
$$L7 = L8$$
$$L6 \ne L8 - L6$$
$$L5 \ne L7 - L5$$

In the surface acoustic wave device according to the above listed third through fifth aspects of the present invention, the value of $\alpha$ should desirably be smaller than 1, and equal to or larger than 0.2. The optimum value of $\alpha$ is represented by $0.2 \le \alpha < 1$.

The surface acoustic wave device according to the third through fifth aspects of the present invention should desirably have a variable L6/L8. The optimum values of L6/L8 indicate sequential increment from the inter-digital transducer toward the opposite side, or indicate sequential decrement from the inter-digital transducer toward the opposite side.

Forming the surface acoustic wave device as described above prevents the surface acoustic wave from being converted into the surface skimming bulk wave and reduces the reflection coefficient of the surface skimming bulk wave of the reflector, thereby attenuating the generation of spurious and improving the energy enclosure efficiency of the surface acoustic wave.

The surface acoustic wave device according to the sixth aspect of the present invention is designed such that the surface acoustic wave devices according to the above listed first through fifth aspects are connected in a ladder form to a single piezoelectric substrate.

A small-size, small-loss, and high-performance filter can be realized using as resonators the surface acoustic wave devices of the above listed first through fifth aspects of the present invention.

DESCRIPTION OF THE PREFERRED EMBODIMENTS

The detailed explanation is described below by referring to the attached drawings.

Figure 3:
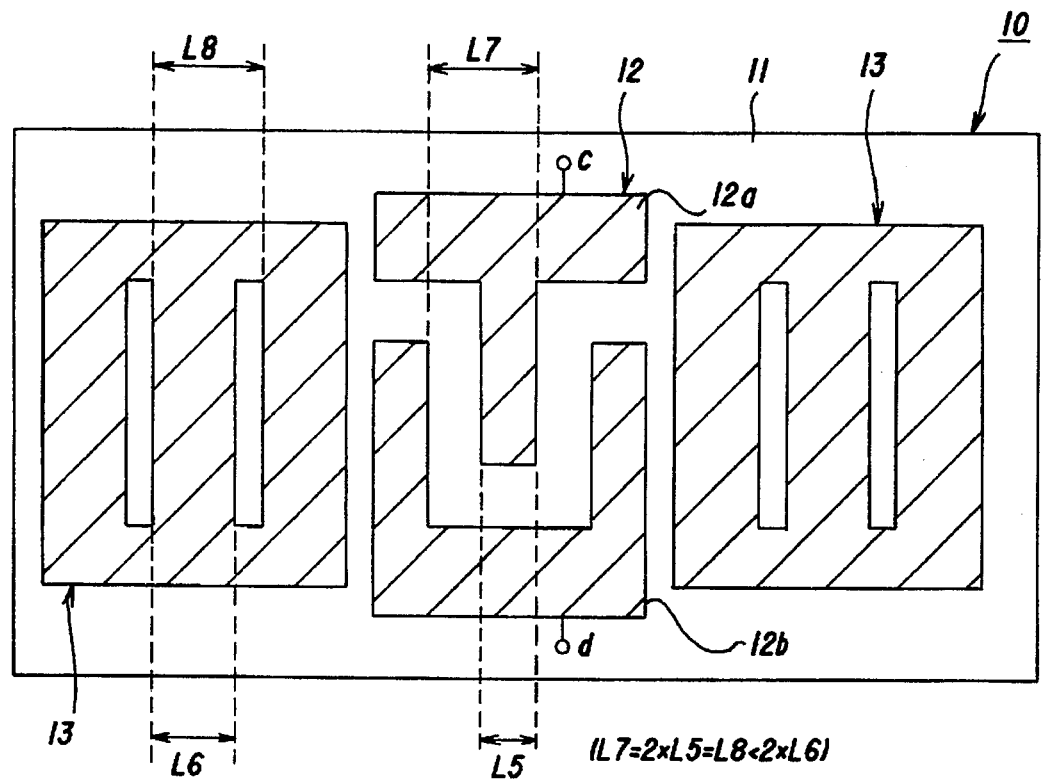
FIG. 3 shows the appearance of the surface acoustic wave device according to the first embodiment of the present invention.

FIG. 3 shows the appearance of a model of a surface acoustic wave device (resonator) 10 according to the first embodiment of the present invention.

As shown in FIG. 3, the surface acoustic wave device 10 comprises an inter-digital transducer 12 mounted on a piezoelectric monocrystal substrate 11, and reflectors 13 provided on both sides of the inter-digital transducer 12. The reflector 13 is a short-strip reflector. The inter-digital transducer 12 comprises two comb-shaped driving electrodes 12a and 12b with the electrode dyes of the comb-shaped driving electrode 12a and those of the comb-shaped driving electrode 12b inserted alternately.

Input terminal c receives an input signal for exciting the surface acoustic wave, and is connected to the comb-shaped driving electrode 12a (input comb-shaped driving electrode). An electric signal of the frequency in the passband width Δf is retrieved through output terminal d which is connected to the comb-shaped driving electrode 12b (output comb-shaped driving electrode). With this configuration, output from output terminal d is only the components within the passband width Δf indicating the center frequency $f_0$ from among the electric signals received by input terminal c. That is, the surface acoustic wave device 10 functions as resonator.

Figure 1:
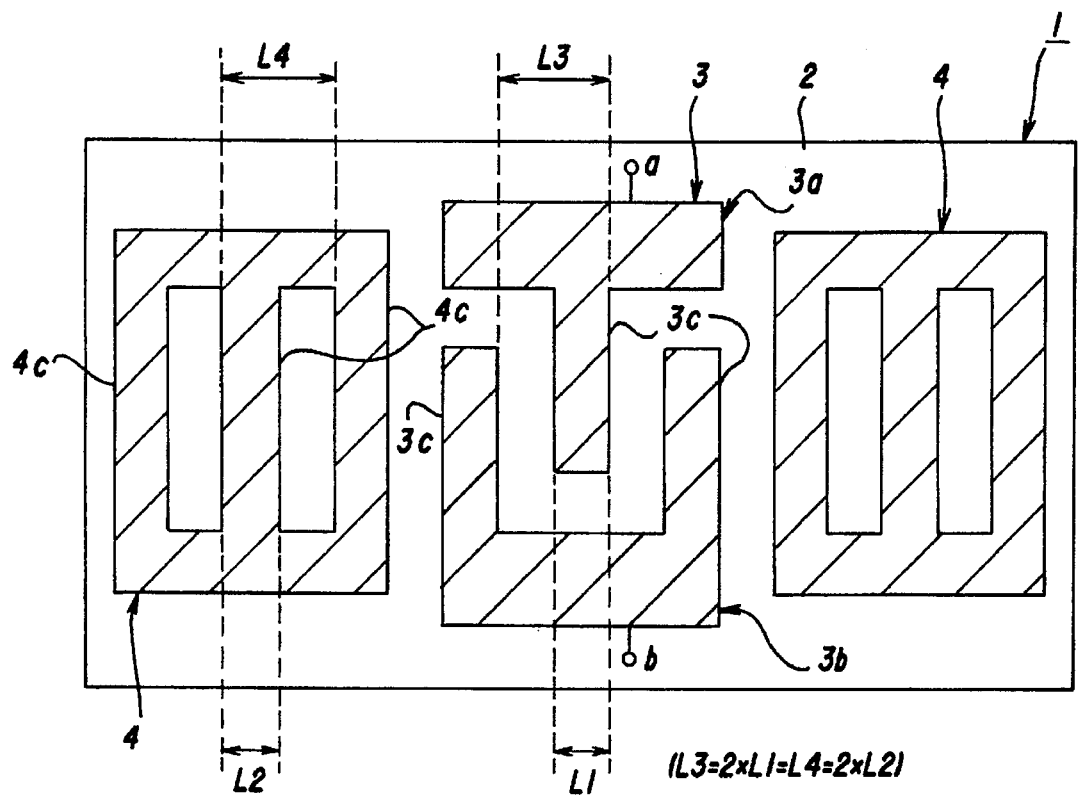
FIG. 1 shows the appearance of the conventional surface acoustic wave device.
Figure 2:
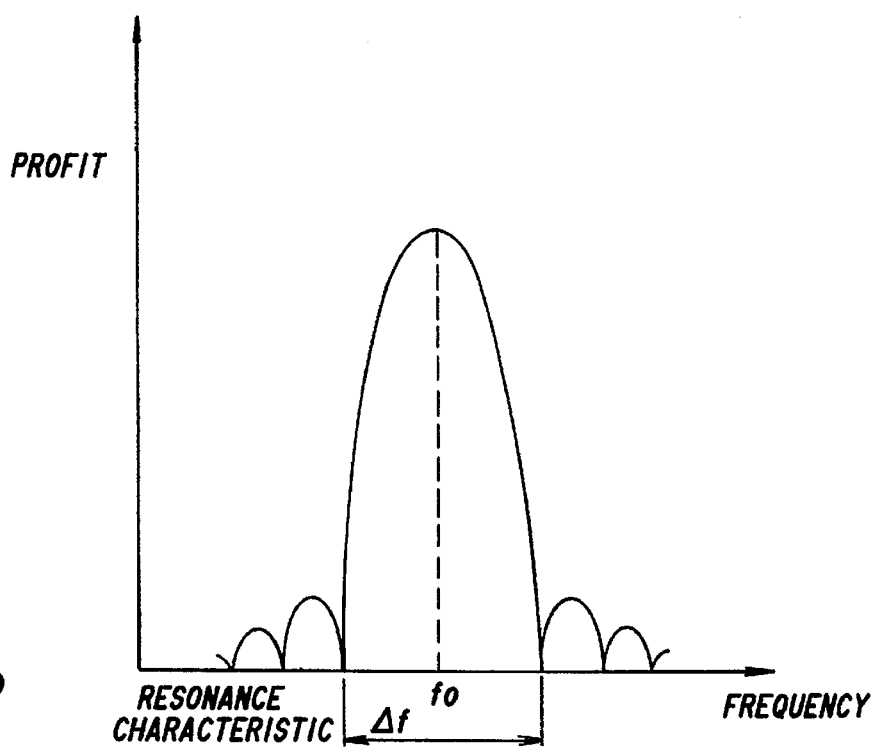
FIG. 2 shows the resonance characteristic of the surface acoustic wave device.

In FIG. 3, the grating cycles L7 and L8 indicate, as in FIG. 1, the distance between the left-side ends or the right-side ends of the adjacent comb-shaped driving electrode 12a and 12b to clearly represent the relation between the grating cycle L7 and the electrode finger width L5 and between the grating cycle L8 and the electrode finger width L6. In FIG. 3, the distances between the centers of the adjacent electrode fingers of the inter-digital transducer 12 and the reflector 13 equal the grating cycle L7 and grating cycle L8 respectively.

With this configuration, the grating cycle L7 is equal to the grating cycle L8, and the inter-digital transducer 12 and the reflector 13 are made of the same material with an equal thickness h of the film according to the present embodiment. Under the conditions, various tests are conducted to measure the frequency of the surface acoustic wave propagating each portion of the inter-digital transducer 12 and the reflector 13 with the respective electrode finger widths L5 and L6 varied properly. The piezoelectric monocrystal substrate 11 is made of LiTaO$_3$ (the propagation velocity of the surface acoustic wave on the free surface is approximately 4,000 m/s). The inter-digital transducer 12 and the reflector 13 are made of aluminum, and the number of pairs of electrodes is 53 for the inter-digital transducer 12 and 100 for the reflector 13. The thickness h of the film of the inter-digital transducer 12 and the reflector 13 is determined to represent h/λ=8% (where λ indicates the wave length of the surface acoustic wave). The overlap length of the electrode dyes (aperture length) is 17λ.

When the tests are conducted with variable L6 where L7=L8=2.000 μm, L5=1.000 μm, and L6>L5, an extremely high enclosure efficiency can be obtained with the value of L6 set approximately to 1.026 μm. At this time, the frequencies $f_d$ and $f_r$ of the surface acoustic wave at the inter-digital transducer 12 and the reflector 13 are 952.15 MHz (=$f_d$) and 949.19 MHz (=$f_r$) respectively.

Therefore, the difference Df (MHz) in frequency of surface acoustic wave between the inter-digital transducer 12 and the reflector 13 can be calculated by the following equation.

$$\begin{aligned} Df &= f_d - f_r \\ &= 952.15 - 949.19 \\ &= 2.96 \end{aligned}$$

The ratio Dfr (%) of the difference in frequency is calculated as follows.

$$\begin{aligned} Dfr &= Df \cdot 100/f_d \\ &= 296/952.15 \\ &= 0.311 \end{aligned}$$

The ratio α (=L6/L5) of the electrode finger width L6 of the reflector 13 to the electrode finger width L5 of the inter-digital transducer 12 is approximately 1.026 (=1,026/1,000). The relation between the ratio of the electrode finger width to the grating cycle of the inter-digital transducer 12 and that of the reflector 13 is determined to be L5/L7 (=0.5)<L6/L8 (≈0.513).

When the tests are conducted with variable L5 where L7=L8=2,000 μm, L6=1,000 μm, and L6>L5, an extremely high enclosure efficiency can be obtained with the value of L5 set approximately to 0.981 μm. At this time, the frequencies of the surface acoustic wave at the inter-digital transducer 12 and the reflector 13 are 954.28 MHz (32 $f_d$) and 952.15 MHz (=$f_r$) respectively.

Therefore, the difference Df (MHz) in frequency of surface acoustic wave between the inter-digital transducer 12 and the reflector 13 can be calculated by the following equation.

$$\begin{aligned} Df &= f_d - f_r \\ &= 954.28 - 952.15 \\ &= 2.13 \end{aligned}$$

The ratio Dfr (%) of the difference in frequency is calculated as follows.

$$\begin{aligned} Dfr &= Df \cdot 100/f_d \\ &= 213/954.28 \\ &= 0.223 \end{aligned}$$

The ratio α of the electrode finger width L6 to the electrode finger width L5 is approximately 1.019 (=1.000/0.981). The relation between the ratio of the electrode finger width to the grating cycle of the inter-digital transducer 12 and that of the reflector 13 is determined to be L5/L7 (≈0.491)<L6/L8 (=0.5).

Under the condition that the grating cycle L7 equals the grating cycle L8, the difference Df (ratio Dfr) in frequency of the surface acoustic wave between the inter-digital transducer 12 and the reflector 13 can be controlled by controlling the difference between the electrode finger width L5 of the inter-digital transducer 12 and the electrode finger width L6 of the reflector 13, thereby optimally adjusting the value of the difference Df (ratio Dfr) in frequency.

The equation v=f·λ exists where f indicates the frequency of the surface acoustic wave, v indicates the propagation velocity of the surface acoustic wave, and λ indicates the wave length of the surface acoustic wave. The wave length λ depends on the grating cycles L7 and L8 on each point of the inter-digital transducer 12 and the reflector 13. According to the first embodiment, the grating cycle L7 equals the grating cycle L8. Therefore, the difference Df (ratio Dfr) in frequency of the surface acoustic wave between the inter-digital transducer 12 and the reflector 13 is adjusted by controlling the propagation velocity of the surface acoustic wave in the inter-digital transducer 12 and the reflector 13.

Based on the mass load effect, the propagation velocity of the surface acoustic wave in the surface acoustic wave device 10 becomes lower as the thickness of the film (of the inter-digital transducer 12 and the reflector 13) is made thicker. Conventionally, there has been a method of optimally adjusting the difference Df (ratio Dfr) in frequency of the surface acoustic wave between the inter-digital transducer 12 and the reflector 13 by controlling the propagation velocity of the surface acoustic wave in the inter-digital transducer 12 and the reflector 13 using the mass load effect as in the present embodiment under the condition where the grating cycle L7 equals the grating cycle L8 and the thickness of the film differs between the inter-digital transducer 12 and the reflector 13. However, this method requires two types of mask patterns to form the patterns (electrodes) of the inter-digital transducer 12 and the reflector 13. Since at least two pattern forming processes are required, the operations are complicated and require a long working time and a high production cost.

On the other hand, the present embodiment has the electrode finger width L5 of the inter-digital transducer 12 and the electrode finger width L6 of the reflector 13 differ from each other (L5≠L6) with the thickness h of the electrode film and the grating cycle retaining unchanged. That is, the propagation velocity of the surface acoustic wave in the inter-digital transducer 12 and the reflector 13 is optimally adjusted using the mass adding effect by discriminating the ratio of the grating cycle L7 to the electrode dye width L5 in the inter-digital transducer 12 from ratio of the grating cycle L8 to the electrode finger width L6 in the reflector 13 (L5/L7 ≠L6/L8).

As described above, since the present embodiment can assign, unlike the conventional methods, the same thickness h of the film of the electrode to the inter-digital transducer 12 and the reflector 13, the pattern forming process can be performed in a single step for the inter-digital transducer 12 and the reflector 13. That is, the propagation velocity of the surface acoustic wave can be easily adjusted in the inter-digital transducer 12 and the reflector 13 while solving the problems of the conventional methods. Thus, easily made is an optimal difference in frequency of the surface acoustic wave between the inter-digital transducer 12 and the reflector 13, thereby reducing the generation of spurious in the surface acoustic wave device 10 and the radiation of a bulk wave. As a result, the surface acoustic wave can be efficiently enclosed with minimum possible energy loss and the performance of the resonator can be successfully improved. The value h/λ is normally set in the surface acoustic wave device, but is limited because the thickness h of the film should be limited to maintain a predetermined performance of the device. Therefore, the maximum value is about 8%.

Described below to clearly define the effects of the present embodiment is the result of measuring the difference in frequency between the inter-digital transducer 12 and the reflector 18 of the surface acoustic wave device in which L7=L8 and L5=L6. In this measurement, the piezoelectric monocrystal substrate 11 is made of LiTaO$_3$, and the inter-digital transducer 12 and the reflector 13 are made of aluminum. The number of pairs of the electrodes of the inter-digital transducer 12 and the reflector 13, and the aperture length are fundamentally the same as those in the above described measurement.

In the operations of the conventional surface acoustic wave device, the frequency $f_d$ of the inter-digital transducer 12 is 923.0 MHz and the frequency $f_r$ of the reflector 13 is 920.4 MHz where the ratio h/λ of the thickness h of the film to the wavelength λ of the surface acoustic wave in the inter-digital transducer 12 and the reflector 13 is 8%. Accordingly, the difference Df in frequency is 2.6 MHz and the ratio Dfr of the difference in frequency is about 0.282%.

In the inter-digital transducer 12 and the reflector 13, the frequency difference Df becomes larger as the value h/λ increases. However, if the thickness h of the film becomes thicker, then the reliability and the stability of the film are lowered, thereby limiting the thickness h of the film to the maximum value h/λ of approximately 8%. Thus, the upper limit of the ratio Dfr of the frequency difference of the conventional surface acoustic wave device is estimated to be about 0.3%.

According to the present embodiment, the ratio Dfr of the frequency difference of 0.3% is experimentally obtained when the value h/λ=1%, and the electrode dye width L6 is approximately 1.5 (=α) times as large as the electrode dye width L5.

When the result of the present embodiment is compared with that of the conventional surface acoustic wave device, the present embodiment indicates a smaller value of h/λ, that is, indicates a higher ratio Dfr of the frequency difference with smaller thickness h of the film (the conventional device indicates the Dfr of about 0.282% with the value h/λ of about 8%). Thus, the present embodiment has a more advantageous effect than having a larger thickness h of the film in adjusting the ratio Dfr of the frequency difference (Df indicates frequency difference), that is, in adjusting the propagation velocity of the surface acoustic wave in the inter-digital transducer 12 and the reflector 13.

According to the above described embodiment, the piezoelectric monocrystal substrate 11 is made of LiTaO$_3$, and the inter-digital transducer 12 and the reflector 13 are made of aluminum. The piezoelectric monocrystal substrate 11 can also be made of crystal, various piezoelectric ceramics, LiNbO$_3$, Bi$_{12}$SiO$_{20}$, Li$_2$B$_4$O$_7$, etc. The inter-digital transducer 12 and the reflector 13 can also be made of other electrode material such as combination of aluminum and copper in addition to aluminum.

Some piezoelectric materials of the above described piezoelectric monocrystal substrate 11 indicate little difference in propagation velocity of a surface acoustic wave in the inter-digital transducer 12 and the reflector 13. Accordingly, with such piezoelectric materials, the conventional surface acoustic wave device, in which the grating cycle L7 equals the grating cycle L8 and the thickness h of the film in the inter-digital transducer 12 is the same as that of the surface acoustic wave device 13, cannot obtain a desirable resonator having a high energy enclosure efficiency of the surface acoustic wave. By contrast, the present embodiment successfully generates a high-performance resonator having an appropriate difference in propagation velocity of the surface acoustic wave between the inter-digital transducer 12 and the reflector 13 by adjusting the value L6/L5.

That is, the present embodiment does not specify the material of the piezoelectric monocrystal substrate 11, but works effectively regardless of the material of the substrate selected depending on the usage of the device and the required characteristics, and can be used widely for general purpose.

In the present embodiment, the grating cycle L7 is equal to the grating cycle L8 while either the electrode finger width L5 or the electrode dye width L6 is altered. However, both electrode finger width L5 and electrode finger width L6 can be altered on condition of L5<L6. In the piezoelectric monocrystal substrate 11, as the ratio L5/L7 of the electrode dye width L5 to the grating cycle L7 and the ratio L6/L8 of the electrode dye width L6 to the grating cycle L8 becomes higher, the mass load effect is larger and the propagation velocity of the surface acoustic wave is higher in the inter-digital transducer 12 and the reflector 13. Therefore, altering the electrode finger width L5 and the electrode finger width L6 to satisfy the expression L5/L7<L6/L8 increases the mass adding effect at the reflector 13 more than the inter-digital transducer 12 such that the difference Df (ratio Dfr) in frequency of the surface acoustic wave between the inter-digital transducer 12 and the reflector 13 can be controlled to be larger.

Figure 4:
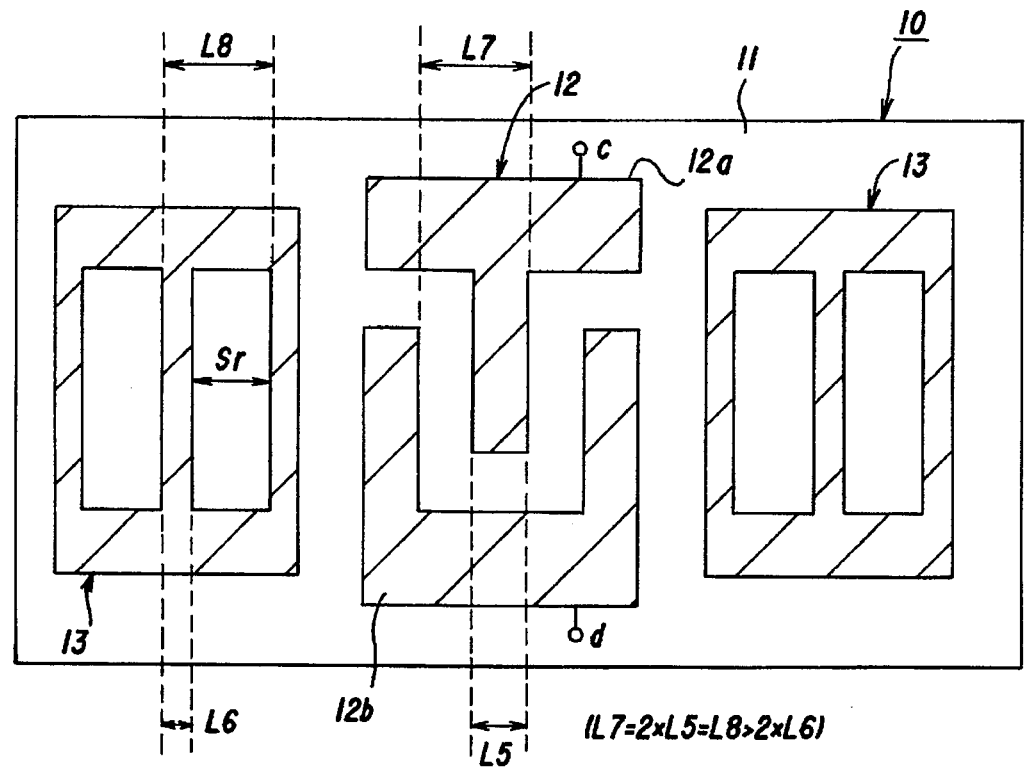
FIG. 4 shows the appearance of the surface acoustic wave device according to the second embodiment of the present invention.

Described below is the second embodiment of the present invention. FIG. 4 shows the appearance of a model of the surface acoustic wave device (resonator) according to the second embodiment. Since the second embodiment has fundamentally the same configuration as the first embodiment shown in FIG. 3, the identification numbers shown in FIG. 3 are also used in the following description.

In FIG. 4, the grating cycle L7 is equal to the grating cycle L8, and the material and the thickness h of the film are the same in the inter-digital transducer 12 and the reflector 13. With the configuration according to the second embodiment, described below are the results of various operations for checking the frequency characteristics with the electrode finger width L6 changed. The common conditions of the operations are 53 pairs of the inter-digital transducers 12; 100 reflector 13, and 17λ in aperture length in the inter-digital transducer 12 and the reflector 13. As for the material, the piezoelectric monocrystal substrate 11 is made of LiTaO$_3$, and the inter-digital transducer 12 and the reflector 13 are made of aluminum mixed with copper.

The distance between the electrode fingers of the reflector 13 (=L8–L6) of the reflector 13 is obtained by subtracting the electrode finger width L6 from the grating cycle L8 of the grating cycle L3, and is defined as space $S_r$. The ratio of the electrode finger width L6 to the space $S_r$, that is, L6/(L8–L6) is hereinafter referred to as an L/S ratio. The L/S ratio is likewise defined for the inter-digital transducer 12.

Figure 5A:
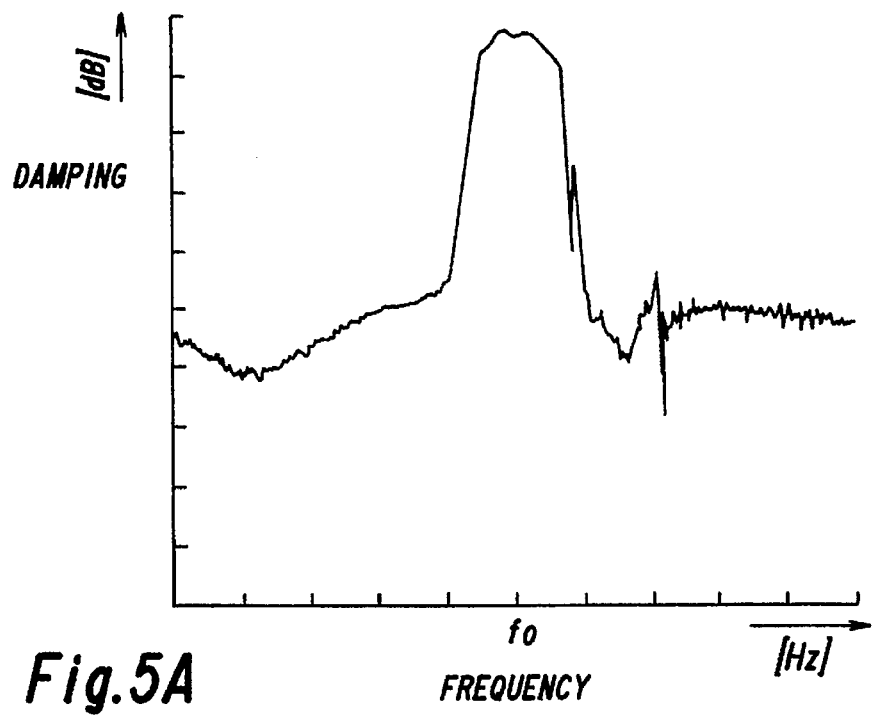
FIGS. 5A through 5C show the frequency characteristic of the conventional surface acoustic wave device (where L/S= 1) compared with the second embodiment of the present invention, the frequency characteristic of the second embodiment (where L/S =1.3), and the frequency characteristic of the second embodiment (where L/S=0.7) respectively.
Figure 5B:
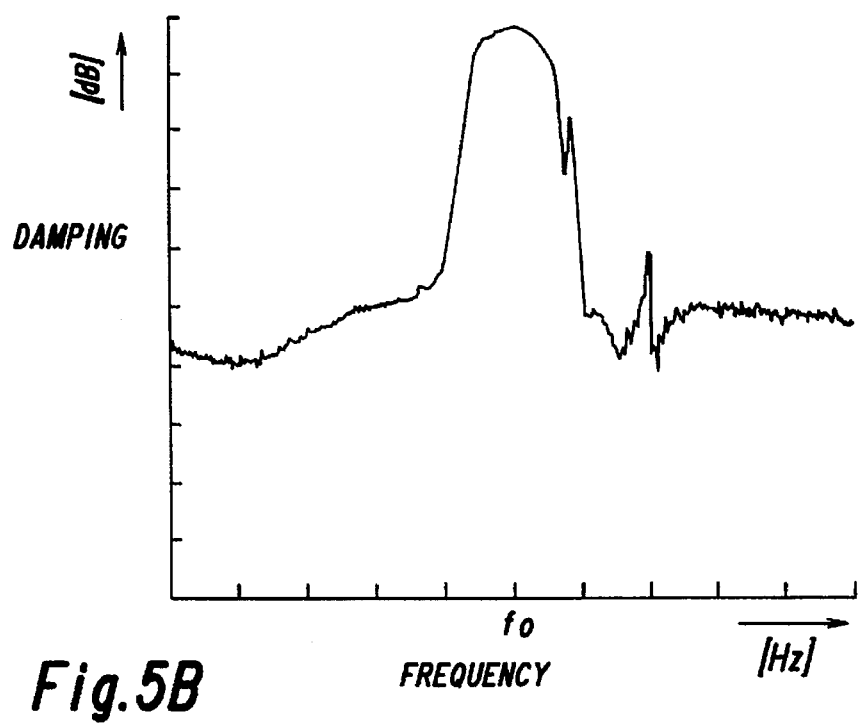
Figure 5C:
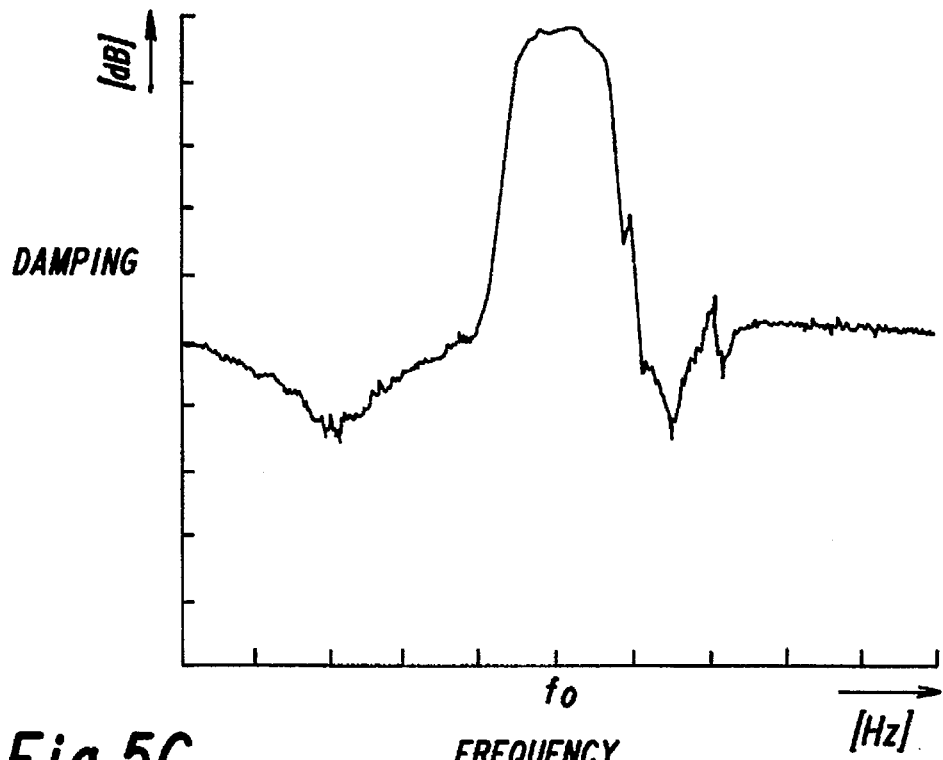

FIG. 5A shows the frequency characteristics with the L/S ratio of the reflector 13 set to 1. Likewise, FIG. 5B shows the frequency characteristics with the L/S ratio set to 1.3. FIG. 5C shows the frequency characteristics with the L/S ratio set to 0.7. Accordingly, FIG. 5A shows the conventional surface acoustic wave device 1; FIG. 5B shows the first embodiment of the present invention; and FIG. 5C shows the second embodiment of the present invention. In FIGS. 5A through 5C, the vertical and horizontal axes have equal scales, and the center frequency $f_0$ is 350 MHz.

As compared with FIG. 5A, FIG. 5B shows the conspicuous improvement in frequency characteristic at the higher frequency area within the passband. Likewise, as compared with FIG. 5A, FIG. 5C also shows the conspicuous improvement in frequency characteristic at the higher frequency area within the passband.

Thus, according to the second embodiment, setting the electrode finger width L6 to a value smaller than the space $S_r$, that is, setting the L/S ratio to a smaller value, improves the frequency characteristic. This is because the surface acoustic wave is prevented from being converted into the surface skimming bulk wave in the reflector 13, that is, the generation of spurious is reduced, and because the radiation of the surface skimming bulk wave is also reduced.

The radiation coefficient of the surface skimming bulk wave can be reduced in the reflector 13, and the influence of the surface skimming bulk wave can be attenuated without thickening the film of the electrode finger of the reflector 13 with the generation of spurious reduced. As a result, the thickness H of the film of the electrode in the inter-digital transducer 12 and the reflector 13 can be reduced than that in the surface acoustic wave device 1. Thus, using a thinner film in the electrodes of the inter-digital transducer 12 and the reflector 13 prevents the uneven thickness h and form of the film, thereby improving the reliability and stability of the film of the electrode. Thus, the device can have characteristics as an excellent resonator. In the production of the devices, the process time required for forming and etching the films of the electrodes can be effectively shortened and therefore obtained is high production throughput.

Furthermore, the surface acoustic wave device 1 requires the value h/λ of about 7% to make difference in propagation velocity between the surface acoustic wave and the surface skimming bulk wave. However, the narrow electrode finger width L6 reduces the generation and influence of the surface skimming bulk wave, and the value h/λ can be reduced to approximately 3% without lowering the performance of the device. Practically, for example, the conventional thickness h, that is 1 μm, of the film of the electrode can be reduced to 0.5 μm to obtain an excellent performance. Changing the thickness h of the film from 1 μm into 0.5 μm results in reducing uneven thickness and form of the film of the electrode, thereby shortening the operation time required to form the electrode down to ⅓ of the conventional method.

According to the second embodiment, setting the L/S ratio of the reflector 13 as smaller than 1 prevents the generation of the surface skimming bulk wave, that is, spurious. This is attained by preventing the surface acoustic wave generated in the reflector 13 from being converted into the surface skimming bulk wave. A higher effect can be obtained by changing the L/S ratio of the inter-digital transducer 12 as well as the reflector 13. The ratio α (=L5/L6) of the electrode finger width L5 of the inter-digital transducer 12 to the electrode finger width L6 of the reflector 13 should satisfy 0.2≦α<1.0 to obtain a desirable result.

Described next is the third embodiment of the present invention.

The third embodiment is a surface acoustic wave filter in which the above described surface acoustic wave device 10 is connected as a resonator in a ladder form as a resonator to a single piezoelectric crystal substrate.

Figure 6:
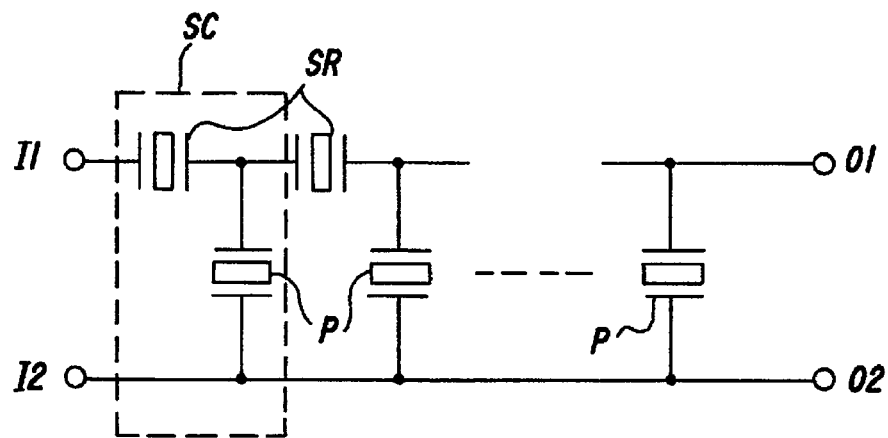
FIG. 6 shows the circuit as an example of the latter-form filter according to the third embodiment in which the second embodiment of the present invention is used for a serial and parallel resonator.

FIG. 6 shows the configuration of the surface acoustic wave filter. In FIG. 6, SR indicates a serial resonator; and P indicates a parallel resonator. A basic circuit, that is, a section SC, is designed as an L-shaped combination of one serial resonator SR and one parallel resonator for cascade connection. Signals input through input terminals I1 and I2 are output through output terminals O1 and O2.

In each of the serial resonator SR and parallel resonator P connected in a ladder form, the results of measuring the characteristics of the filter with the L/S ratio changed in the reflector 13 are explained below.

The common conditions according to the third embodiment are: the ratio (=Cp/Cs) of the capacitance $C_s$ of the serial resonator SR to the capacitance Cp of the parallel resonator P is 0.6. The grating cycles L7 and L8 are 2.725 μm for the serial resonator SR and 2.80 μm for the parallel resonator P. The number of pairs of the inter-digital transducer 12 is 40 for the serial resonator SR and 80 for the parallel resonator P. The aperture length is 85 μm for the serial resonator SR and 51 μm for the parallel resonator P. The number of pairs of the reflectors 13 is 100 for both serial resonator SR and parallel resonator P. The piezoelectric monocrystal substrate 11 is made of LiTaO$_3$, and the inter-digital transducer 12 and the reflector 13 are made of aluminum mixed with copper. The value h/λ is 7%, and the number of cascade-connected sections SC is 3.

Figure 7A:
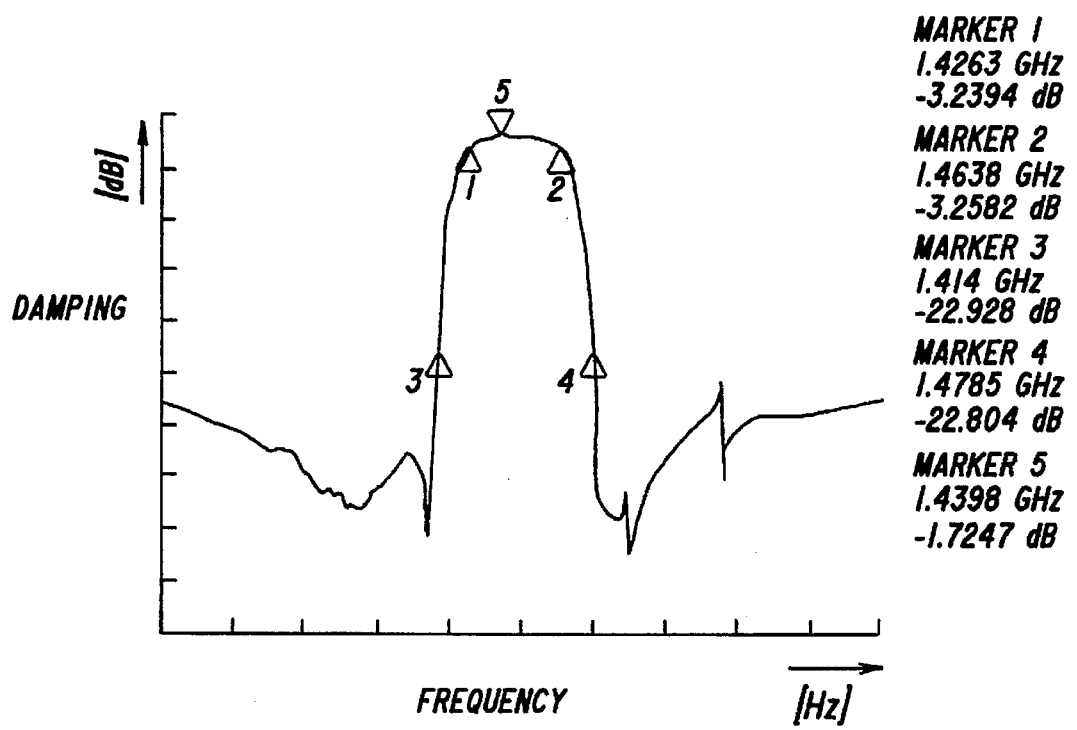
FIGS. 7A through 7C show the frequency characteristic of the conventional surface acoustic wave device (case 1) compared with the third embodiment of the present invention, the frequency characteristic of the surface acoustic wave device (case 2) according to the third embodiment of the present invention, and the frequency characteristic of the surface acoustic wave device (case 3) according to the third embodiment of the present invention respectively.
Figure 7B:
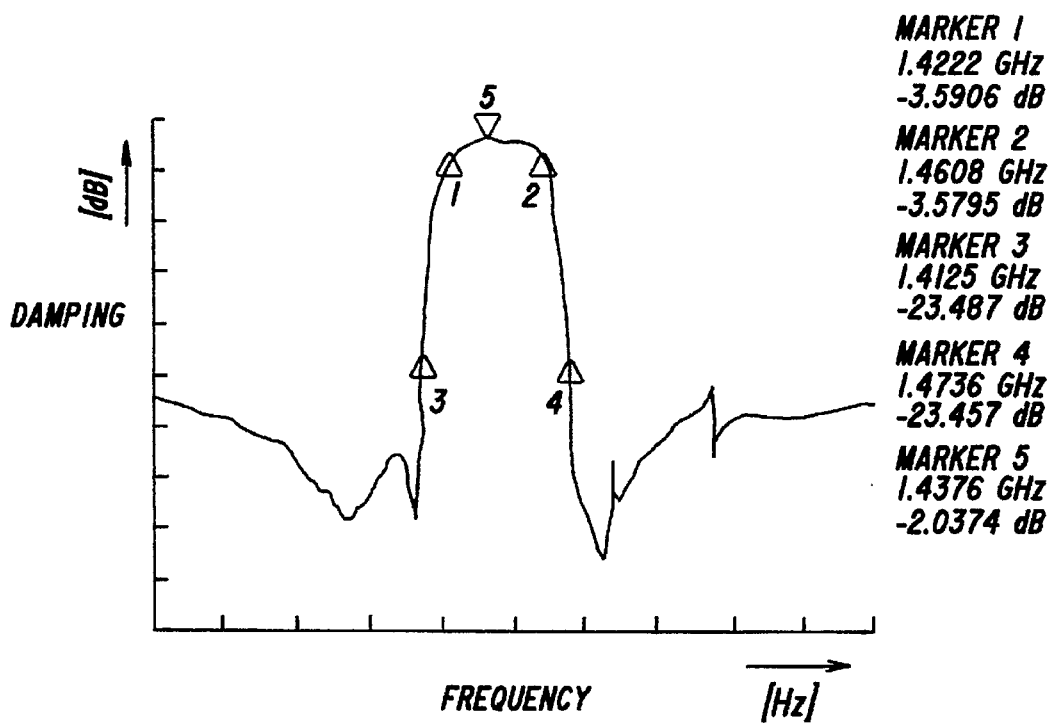
Figure 7C:
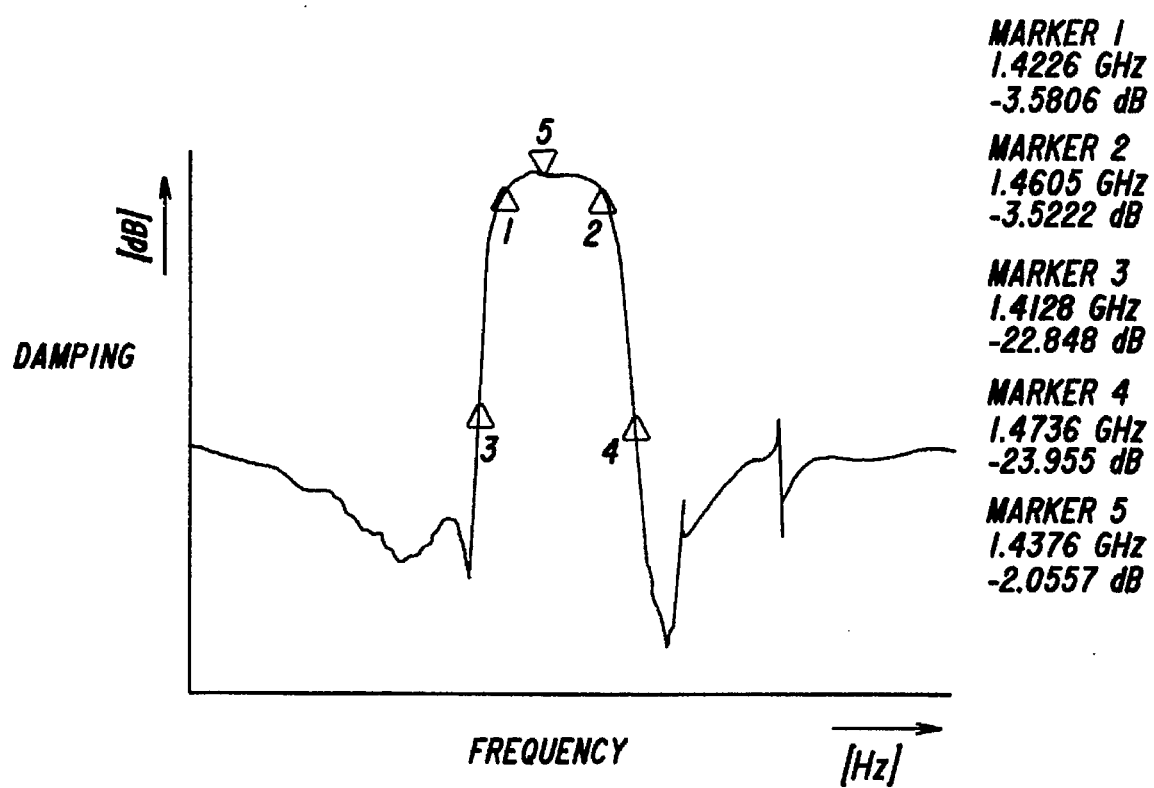

Under the above listed conditions, case 1 shown in FIG. 7A is designed to have the L/S ratio of 1 for the inter-digital transducer 12 and the reflector 13. Each of their resonators corresponds to the surface acoustic wave device 1 of the conventional method. Case 2 shown in FIG. 7B is based on that shown in FIG. 7A, and the L/S ratio of the reflector 13 is stepwise altering every 20 pairs in the direction from the inter-digital transducer 12 into 0.563, 0.538, 0.515, 0.493, and 0.471. Likewise, case 3 shown in FIG. 7C is based on that shown in FIG. 7A, and the L/S ratio of the reflector 13 is stepwise altering every 20 pairs in the direction from the inter-digital transducer 12 into 0.471, 0.493, 0.515, 0.538, and 0.563. FIGS. 7A through 7C show the results of the operations of cases 1 through 3.

Figure 8:
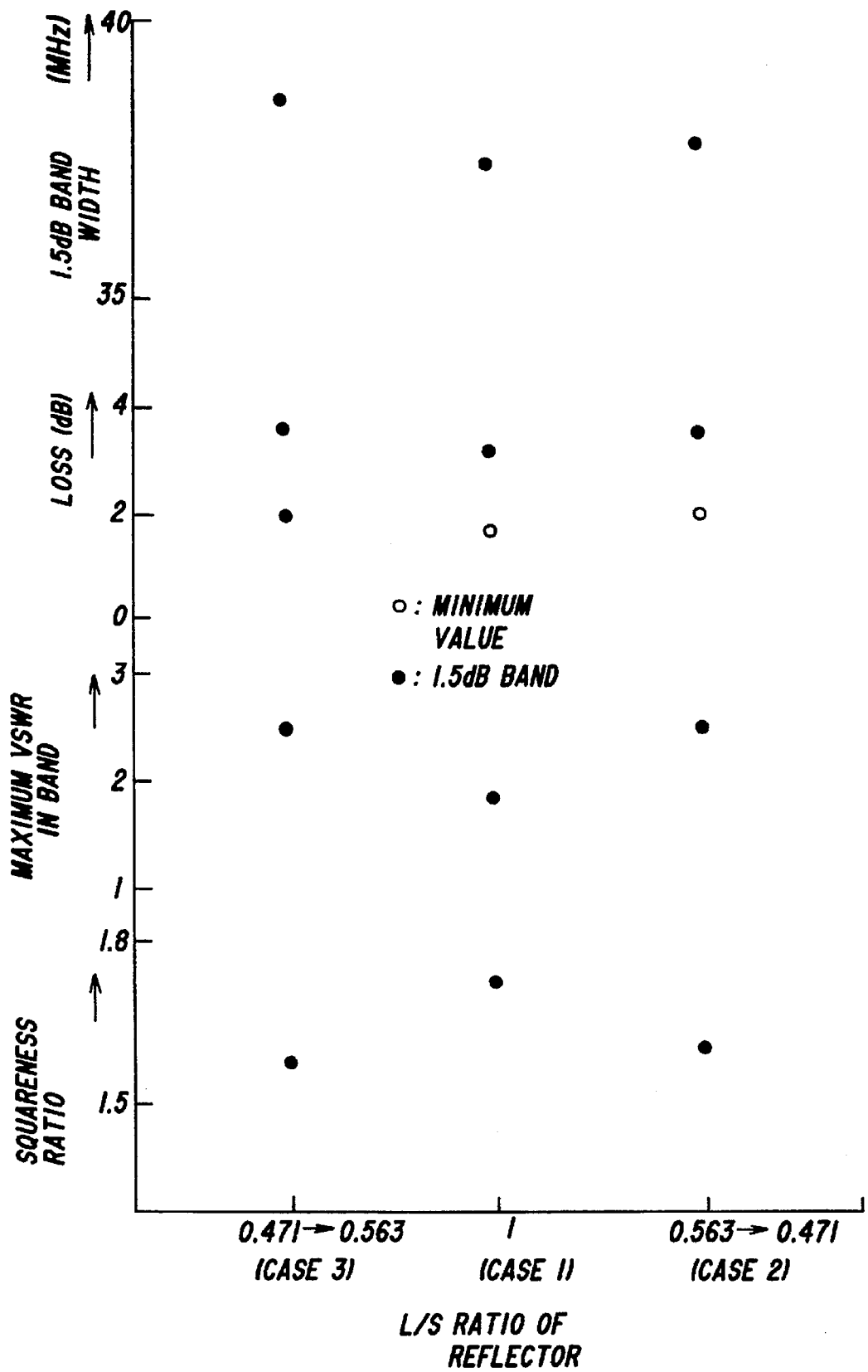
FIG. 8 is the graph showing various important parameter values representing the filter characteristics in the above listed surface acoustic wave devices 1 through 3.
Figure 9:
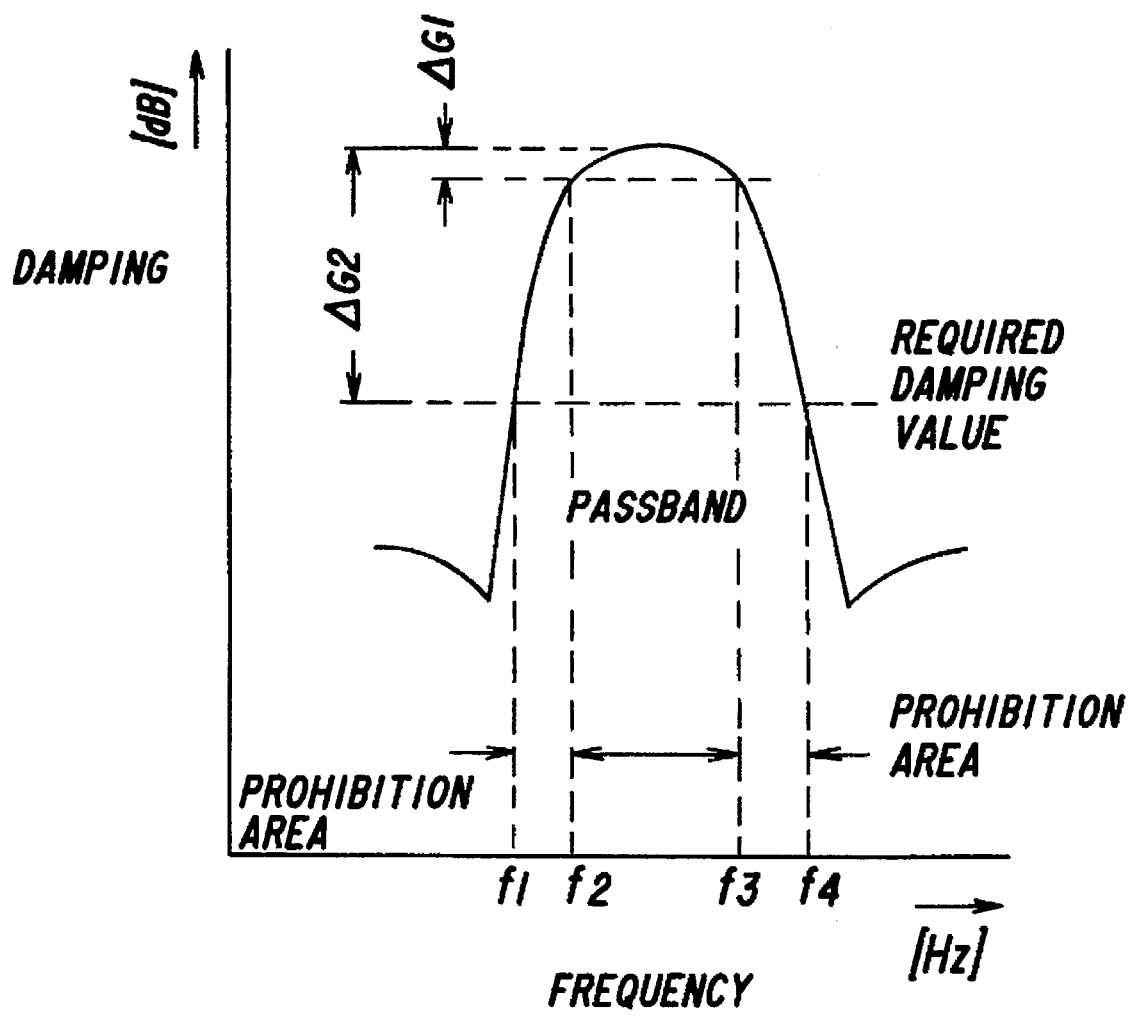
FIG. 9 shows the method of calculating the squareness ratio.

FIG. 8 shows the filter (frequency) characteristics of cases 1 through 3 shown in FIGS. 7A through 7C. In FIG. 8, compared are the surface acoustic wave devices on the four important characteristics of the filter, that is, the squareness ratio, the maximum voltage standing wave ratio (VSWR) in a specified band, the loss (insertion loss) in the specified band, and the 1.5 dB band width. Described below is the method of calculating the squareness ratio. FIG. 9 shows the squareness ratio calculation method. In FIG. 9, ΔG1 and ΔG2 indicate damping width. Damping width ΔG1 indicates the difference between the peak value and the minimum value within the passband, and damping width ΔG2 indicates the difference between the peak value and the required damping value. f1 indicates the maximum frequency within the prohibition area in the low band. f2 indicates the minimum frequency within the passband. f3 indicates the maximum frequency within the passband. f4 indicates the minimum frequency within the prohibition area in the high band.

In FIG. 9, the squareness ratio can be calculated by the following equation.

H=(minimum frequency within the prohibition area in the high band--maximum frequency within the prohibition area in the low band)/(maximum frequency within the passband--minimum frequency within the passband)

$$=(f4-f1)/(f3-f2)$$

where H indicates the squareness ratio.

According to the third embodiment, ΔG1 is set to 1.5 dB, ΔG2 is set to 21.5 dB in the squareness ratio calculated as described above.

As compared with case 1, cases 2 and 3 indicate a little lower loss value and maximum VSWR as shown in FIG. 18, but the values are allowable. However, the 1.5 dS band width and the squareness ratio are improved more greatly than in case 1. Since these characteristics are important factors in evaluating the performance of the filter, changing the L/S ratio as in cases 2 and 3 proves to guarantee the improvement of the filter.

As compared with case 2, case 3 indicates more desirable results in 1.5 dB band width and squareness ratio. Thus, the performance of a filter in the ladder form can be effectively improved by stepwise changing the L/S ratio of the reflector 13 in the direction from the inter-digital transducer 12 as in case 3.

It is well known that the performance of a surface acoustic wave filter depends on the performance of each surface acoustic wave device. A better filter performance can be obtained by a better surface acoustic wave device as a resonator. The surface acoustic wave device 10 according to the first and second embodiments has improved performance as a surface acoustic wave device. Therefore, a surface acoustic wave filter of excellent filter performance can be realized by using these surface acoustic wave devices as serial resonators SR and parallel resonators P.

Some ladder-formed connections are used in surface acoustic wave devices, but the present invention is not limited to the connection shown in FIG. 6. Since a surface acoustic wave device having improved performance is used as a resonator in the surface acoustic wave filter according to the present invention, the excellent filter performance sufficiently works regardless of its connection format.

The surface acoustic wave device has the merits of having a high center frequency $f_0$ and a wide band width. Therefore, it can be widely used as a filter, resonator, etc. in a digital portable communications apparatus, voltage control oscillator (VCO), etc. Thus, the present invention can successfully improve the performance of these apparatuses.

As described above, under the condition that the grating cycle L7 equals the grating cycle L8, the difference in frequency of the surface acoustic wave between the inter-digital transducer 12 and the reflector 13 can be adjusted by controlling the difference between the electrode finger width L5 of the inter-digital transducer 12 and the electrode finger width L6 of the reflector 13, thereby optimally adjusting the value of the difference in frequency.

According to the present invention, under the condition that the grating cycle L7 equals the grating cycle L8, changing the electrode finger width of only the reflector 13 or both inter-digital transducer 12 and reflector 13 prevents a surface acoustic wave in the reflector 13 from being converted into an SSBW and reduces the reflection coefficient of the SSBW.

As a result, the present invention improves the device characteristics of resonators and filters because the energy enclosure efficiency of the surface acoustic wave device can be improved with the generation of spurious and radiation of a bulk wave effectively reduced.

Since the generation of spurious and the radiation of a bulk wave can be minimized, the thickness of the film of each electrode in the reflector 13 can be made thinner without deteriorating the performance of the device, thereby successfully improving the reliability and stability of the film, reducing uneven thickness of the film or uneven form of the electrode, and resulting in various advantageous effects such as shortening an operation time required for forming the electrode, etc.

As described above, the surface acoustic wave device in each aspect has improved performance. Using the surface acoustic wave device as a serial resonator and a parallel resonator, an effective filter can be formed on a piezoelectric monocrystal substrate. Thus realized is a small-size, small-loss, and high-performance filter.

What is claimed is:

1. A surface acoustic wave device comprising a piezoelectric substrate, an inter-digital transducer provided on a surface of the piezoelectric substrate, and reflectors mounted as opposed to each other on both sides of the inter-digital transducer on the surface of the piezoelectric substrate wherein $$\alpha \cdot L5 = L6;$$
$$L7 = L8;$$

α indicates a coefficient (≠1);

L5 indicates an electrode finger width of the inter-digital transducer;

L6 indicates the electrode finger width of the reflector;

L7 indicates a grating cycle of the inter-digital transducer; and wherein

L8 indicates the grating cycle of the reflector.

2. The surface acoustic wave device according to claim 1, wherein said α is larger than 1.

3. The surface acoustic wave device according to claim 1, wherein said α is equal to or smaller than 1.5.

4. The surface acoustic wave device according to claim 1, wherein said α is larger than 1 and equal to or smaller than 1.5.

5. The surface acoustic wave device according to claim 1, wherein said surface acoustic wave device is mounted in a ladder form on said piezoelectric substrate.

6. A surface acoustic wave device comprising a piezoelectric substrate, an inter-digital transducer provided on a surface of the piezoelectric substrate, and reflectors mounted as opposed to each other on both sides of the inter-digital transducer on the surface of the piezoelectric substrate wherein $$L5/L7 < L6/L8;$$

L5 indicates an electrode finger width of the inter-digital transducer;

L6 indicates the electrode finger width of the reflector;

L7 indicates a grating cycle of the inter-digital transducer; and wherein

L8 indicates the grating cycle of the reflector.

7. The surface acoustic wave device according to claim 6, wherein said surface acoustic wave device is mounted in a ladder form on said piezoelectric substrate.

8. A surface acoustic wave device comprising a piezoelectric substrate, an inter-digital transducer provided on a surface of the piezoelectric substrate, and reflectors mounted as opposed to each other on both sides of the inter-digital transducer on the surface of the piezoelectric substrate wherein $$\alpha \ L5 = L6;$$
$$L7 = L8;$$
$$L6 \neq L8 - L6;$$

α indicates a coefficient (≠1);

L5 indicates an electrode finger width of the inter-digital transducer;

L6 indicates the electrode finger width of the reflector;

L7 indicates a grating cycle of the inter-digital transducer; and wherein

L8 indicates the grating cycle of the reflector.

9. The surface acoustic wave device according to claim 8, wherein said α is larger than 1.

10. The surface acoustic wave device according to claim 8, wherein said α is larger than 1 and equal to or larger than 1.5.

11. The surface acoustic wave device according to claim 8, wherein said α is smaller than 1 and equal to or larger than 0.2.

12. The surface acoustic wave device according to claim 8, wherein a value of L6/L8 of said reflector is variable.

13. The surface acoustic wave device according to claim 8, wherein said value of L6/L8 of said reflector is sequentially incremented in a direction from said inter-digital transducer to an opposite side.

14. The surface acoustic wave device according to claim 8, wherein said value of L6/L8 of said reflector is sequentially decremented in a direction from said inter-digital transducer to an opposite side.

15. The surface acoustic wave device according to claim 8, wherein said surface acoustic wave device is mounted in a ladder form on said piezoelectric substrate.

16. A surface acoustic wave device comprising a piezoelectric substrate, an inter-digital transducer provided on a surface of the piezoelectric substrate, and reflectors mounted as opposed to each other on both sides of the inter-digital transducer on the surface of the piezoelectric substrate wherein

L5=L6;

L7=L8;

L5≠L7−L5;

α indicates a coefficient (≠1);

L5 indicates an electrode finger width of the inter-digital transducer;

L6 indicates the electrode finger width of the reflector;

L7 indicates a grating cycle of the inter-digital transducer; and wherein

L8 indicates the grating cycle of the reflector.

17. The surface acoustic wave device according to claim 16, wherein said α is smaller than 1.

18. The surface acoustic wave device according to claim 16, wherein said α is equal to or larger than 0.2.

19. The surface acoustic wave device according to claim 16, wherein said α is smaller than 1 and equal to or larger than 0.2.

20. The surface acoustic wave device according to claim 16, wherein a value of L6/L8 of said reflector is variable.

21. The surface acoustic wave device according to claim 16, wherein said value of L6/L8 of said reflector is sequentially incremented in a direction from said inter-digital transducer to an opposite side.

22. The surface acoustic wave device according to claim 16, wherein said value of L6/L8 of said reflector is sequentially decremented in a direction from said inter-digital transducer to an opposite side.

23. The surface acoustic wave device according to claim 16, wherein said surface acoustic wave device is mounted in a ladder form on said piezoelectric substrate.

24. A surface acoustic wave device comprising a piezoelectric substrate, an inter-digital transducer provided on a surface of the piezoelectric substrate, and reflectors mounted as opposed to each other on both sides of the inter-digital transducer on the surface of the piezoelectric substrate wherein $$\alpha \ L5 = L6$$
$$L7 = L8;$$
$$L6 \neq L8 - L6;$$
$$L5 \neq L7 - L5;$$

α indicates a coefficient (≠1);

L5 indicates an electrode finger width of the inter-digital transducer;

L6 indicates the electrode finger width of the reflector;

L7 indicates a grating cycle of the inter-digital transducer; and wherein

L8 indicates the grating cycle of the reflector.

25. The surface acoustic wave device according to claim 24, wherein said α is smaller than 1.

26. The surface acoustic wave device according to claim 24, wherein said α is equal to or larger than 0.2.

27. The surface acoustic wave device according to claim 24, wherein said α is smaller than 1 and equal to or larger than 0.2.

28. The surface acoustic wave device according to claim 24, wherein

A value of L6/L8 of said reflector is variable.

29. The surface acoustic wave device according to claim 24, wherein said value of L6/L8 of said reflector is sequentially incremented in a direction from said inter-digital transducer to an opposite side.

30. The surface acoustic wave device according to claim 24, wherein said value of L6/L8 of said reflector is sequentially decremented in a direction from said inter-digital transducer to an opposite side.

31. The surface acoustic wave device according to claim 24, wherein said surface acoustic wave device is mounted in a ladder form on said piezoelectric substrate.

32. A method of providing a surface acoustic wave device comprising a piezoelectric substrate, an inter-digital transducer provided on a surface of the piezoelectric substrate, and reflectors mounted as opposed to each other on both sides of the inter-digital transducer on the surface of the piezoelectric substrate, comprising a step of providing that:

$$\alpha\ L5\ =\ L6$$
$$L7\ =\ L8;$$

α indicates a coefficient (≠1);

L5 indicates an electrode finger width of the inter-digital transducer;

L6 indicates the electrode finger width of the reflector;

L7 indicates a grating cycle of the inter-digital transducer; and wherein

L8 indicates the grating cycle of the reflector.

33. A method of providing a surface acoustic wave device comprising a piezoelectric substrate, an inter-digital transducer provided on a surface of the piezoelectric substrate, and reflectors mounted as opposed to each other on both sides of the inter-digital transducer on the surface of the piezoelectric substrate, comprising a step of providing that:

$$L5/L7 < L6/L8,$$

L5 indicates an electrode finger width of the inter-digital transducer,

L6 indicates the electrode finger width of the reflector,

L7 indicates a grating cycle of the inter-digital transducer, and providing that L8 indicates the grating cycle of the reflector.

34. A method of providing a surface acoustic wave device comprising a piezoelectric substrate, an inter-digital transducer provided on a surface of the piezoelectric substrate, and reflectors mounted as opposed to each other on both sides of the inter-digital transducer on the surface of the piezoelectric substrate, comprising a step of providing that:

$$\alpha\ L5\ =\ L6,$$
$$L7\ =\ L8,$$
$$L6\ \neq\ L8-L6,$$

α indicates a coefficient (≠1),

L5 indicates an electrode finger width of the inter-digital transducer,

L6 indicates the electrode finger width of the reflector,

L7 indicates a grating cycle of the inter-digital transducer, and providing that L8 indicates the grating cycle of the reflector.

35. A method of providing a surface acoustic wave device comprising a piezoelectric substrate, an inter-digital transducer provided on a surface of the piezoelectric substrate, and reflectors mounted as opposed to each other on both sides of the inter-digital transducer on the surface of the piezoelectric substrate, comprising a step of providing that:

$$\alpha\ L5\ =\ L6,$$
$$L7\ =\ L8;$$
$$L5\ \neq\ L7-L5,$$

α indicates a coefficient (≠1),

L5 indicates an electrode finger width of the inter-digital transducer,

L6 indicates the electrode finger width of the reflector,

L7 indicates a grating cycle of the inter-digital transducer, and providing that L8 indicates the grating cycle of the reflector.

* * * * *